United States Patent
Ravinuthula et al.

(10) Patent No.: US 8,964,880 B2
(45) Date of Patent: Feb. 24, 2015

(54) REDUCTION IN POWER SUPPLY INDUCED JITTER ON A SERDES TRANSMITTER

(75) Inventors: Vishnu Ravinuthula, Allen, TX (US); Dushmantha Rajapaksha, Allen, TX (US); Hugh Mair, Fairview, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/546,635

(22) Filed: Jul. 11, 2012

(65) Prior Publication Data

US 2014/0016718 A1 Jan. 16, 2014

(51) Int. Cl.
*H04L 27/00* (2006.01)

(52) U.S. Cl.
USPC ............ 375/295; 375/344; 375/340; 375/133; 331/4; 331/16; 327/157

(58) Field of Classification Search
CPC .............................. H04L 1/205; H04L 7/0331
USPC ............ 375/295, 344, 340, 133; 331/1, 4, 16; 327/157
See application file for complete search history.

(56) References Cited

U.S. PATENT DOCUMENTS

| | | | | |
|---|---|---|---|---|
| 4,516,083 | A | * | 5/1985 | Turney .......................... 331/1 A |
| 5,825,254 | A | * | 10/1998 | Lee .................................. 331/25 |
| 8,829,954 | B2 | * | 9/2014 | Taghivand et al. ............. 327/118 |
| 2004/0119545 | A1 | * | 6/2004 | Ogiso .............................. 331/74 |
| 2006/0226914 | A1 | * | 10/2006 | Saado ............................ 331/1 A |
| 2007/0080752 | A1 | * | 4/2007 | Smith ............................. 331/16 |
| 2007/0168142 | A1 | * | 7/2007 | Pan et al. ......................... 702/69 |
| 2009/0216080 | A1 | * | 8/2009 | Nakamura .................... 600/109 |

* cited by examiner

*Primary Examiner* — Sam K Ahn
*Assistant Examiner* — Fabricio R Murillo Garcia
(74) *Attorney, Agent, or Firm* — John R. Pessetto; Frederick J. Telecky, Jr.

(57) ABSTRACT

In an embodiment of the invention, a frequency divider in a phase-locked loop (PLL) circuit is provided power from the power supply that provides power to a transmission circuit. The PLL is configured to receive a first direct current (DC) reference voltage, a second DC voltage and a reference clock signal. The PLL is configured to generate a transmission clock signal. A transmission circuit is configured to receive the transmission clock signal, the second DC voltage and a data bus where the data bus includes a plurality of data bits in parallel. The transmission circuit transmits data serially.

8 Claims, 4 Drawing Sheets

REDUCTION IN POWER SUPPLY INDUCED JITTER ON A SERDES TRANSMITTER

BACKGROUND

Serializer/De-serializer (SerDes) circuits are commonly used in high speed communications to increase the rate at which data can be sent and received. Serial communication is the process of sending data one bit at a time, sequentially, over a communication channel or computer bus. This is in contrast to parallel communication, where several bits are sent as a whole, on a link with several parallel channels. Serial communication is usually used for long-distance communication and by most computer networks where the cost of cables makes parallel communication impractical.

In general, data can be transmitted serially at faster rates than if transmitted in parallel because the electrical environment where data is sent can be better controlled. As a result, SerDes circuits usually convert data received in parallel to serial data before transmitting the data. After the data has been transmitted in series, the serial data is converted back to parallel data by SerDes circuits. Parallel data usually may be operated on (i.e. processed) at a higher rate than serial data.

The basic SerDes circuit is usually made up of two functional blocks: the Parallel In Serial Out (PISO) block (i.e. parallel-to-serial converter) and the Serial In Parallel Out (SIPO) block (i.e. serial-to-parallel converter). There are at least 4 different types of SerDes architectures: (1) Parallel clock SerDes, (2) Embedded clock SerDes, (3) 8b/10b SerDes, and (4) Bit interleaved SerDes.

The PISO block typically has a parallel clock input, a set of data input lines, and input data latches. The PISO block may use an internal or an external Phase-Locked Loop (PLL) to provide a clock signal to multiply the incoming parallel clock up to a higher serial frequency.

The SIPO block typically has a receive clock output, a set of data output lines and output data latches. The receive clock may be recovered from the data by a serial clock recovery technique. However, a SerDes circuit that does not transmit a clock uses reference clock to lock a PLL to the correct transmission frequency. The SIPO block then divides the incoming clock down to a parallel data rate.

The integrity of the clock signals used with SerDes circuits is important. Ideally, the variation in the period of a clock signal should be zero. However, in practice this is not the case. When the period of a clock signal varies, clock jitter is created. Clock jitter is a time variation in the period of the clock signal. Clock jitter degrades the transmission and reception of data in SerDes circuits. Therefore it is important to keep the variation in the period of a clock signal as low as possible in order to reduce clock jitter. Reducing clock jitter improves the quality of data transmission in SerDes circuits.

DETAILED DESCRIPTION

The drawings and description, in general, disclose a communication apparatus that reduces jitter in data transmitted serially from a transmission circuit. In an embodiment of the invention, jitter in data transmitted serially from a transmission circuit is reduced by applying the voltage that is applied to the transmission circuit to the frequency divider in the PLL. In another embodiment of the invention, jitter in data transmitted serially from a transmission circuit is reduced when the signal propagation delay through the frequency divider in the PLL is approximately the same as the signal propagation delay through the transmission circuit.

Figure 1:
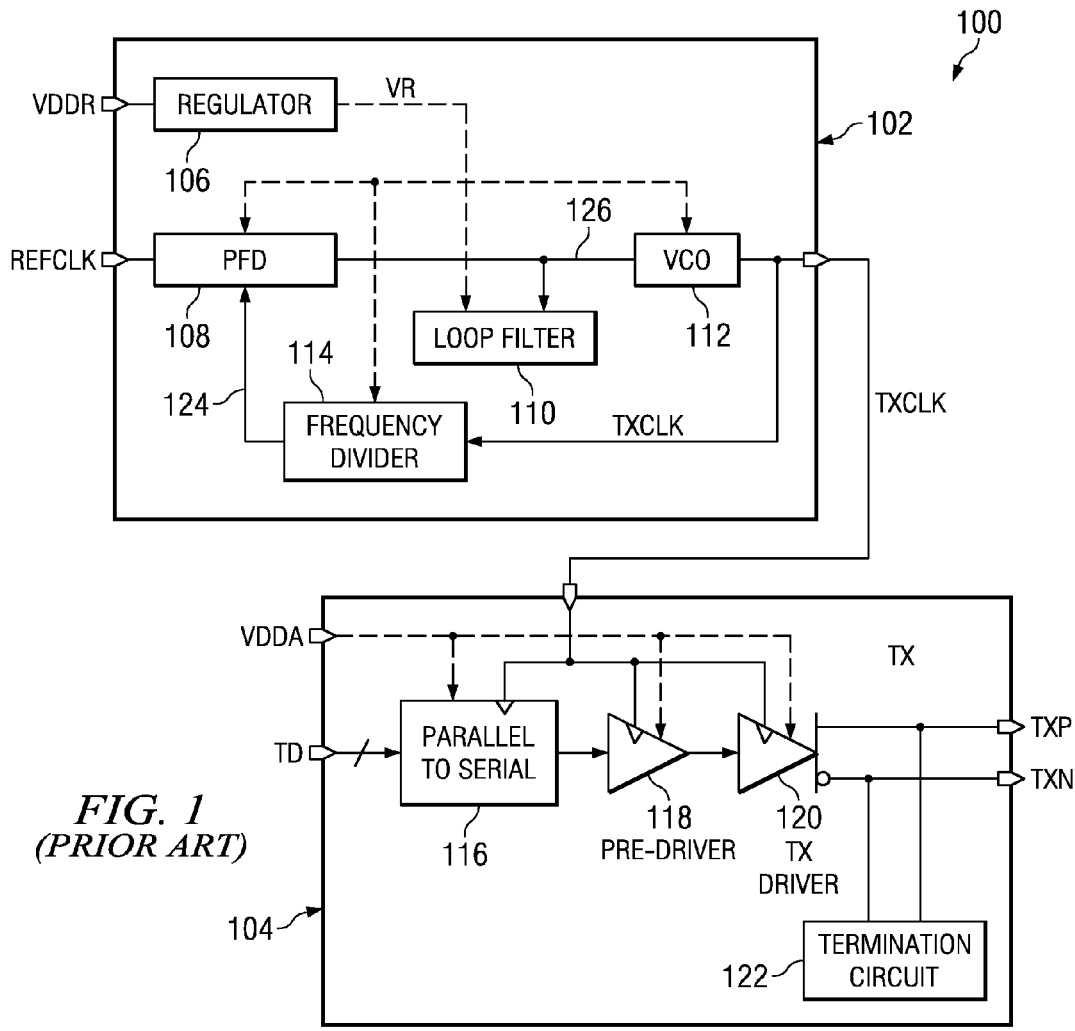
FIG. 1 is a block diagram of a Phase-Locked Loop (PLL) and transmission circuit. (Prior Art)

FIG. 1 is a block diagram of a Phase-Locked Loop (PLL) 102 and transmission circuit 104. The PLL 102 includes a voltage regulator 106, a phase frequency detector (PFD) 108, a loop filter 110, a voltage control oscillator (VCO) 112, and a frequency divider 114. The voltage regulator 106 regulates the voltage VR provided to the phase frequency detector (PFD) 108, the loop filter 110, the voltage control oscillator (VCO) 112, and the frequency divider 114. The PFD 108 compares the phase of the output 124 of the frequency divider 114 and the phase of the reference clock REFCLK. To form a PLL, the PFD 108 phase error output 126 is fed to the loop filter 110. The loop filter 110 integrates the phase error output 126 to smooth it. The smoothed signal 126 is fed to the VCO 112. The VCO 112 generates an output signal TXCLK with a frequency that is proportional to the smoothed signal 126. The output signal TXCLK is a clock signal that is used to clock the transmission circuit 104. The VCO output TXCLK is also fed back to the frequency divider 114 to form the PLL circuit 102.

The transmission circuit 104 includes a parallel-to-serial converter 116, a pre-driver 118, a transmission driver 120 and a termination circuit 122. A parallel data input TD provides an input to the parallel-to-serial converter 116. A voltage VDDA is provided for the parallel-to-serial converter 116, the pre-driver 118 and the transmission driver 120. The transmission clock TXCLK from the PLL 102 is electrically connected to the parallel-to-serial converter 116, the pre-driver 118 and the transmission driver 120. In this example, the transmission driver 120 provides a differential output with two terminals, TXP (transmission positive) and TXN (transmission negative). A termination circuit 122 is provided on the outputs TXP and TXN to provide impedance matching. Data is serially transmitted from the two terminals TXP and TXN.

Figure 2:
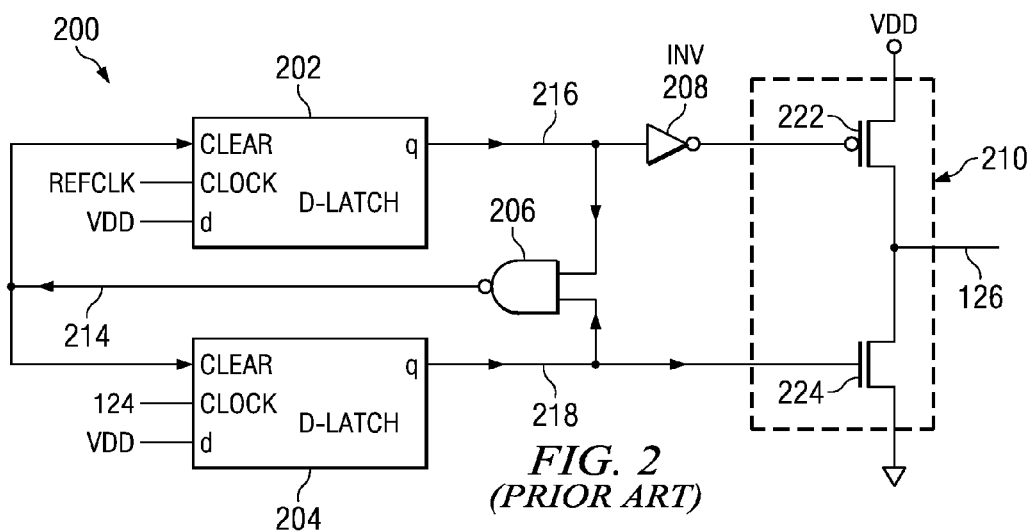
FIG. 2 is a schematic diagram of a phase frequency detector (PFD). (Prior Art)

FIG. 2 is a schematic diagram of a phase frequency detector (PFD) 200. The phase frequency detector 200 in this example includes two D-latches 202 and 204, a NAND gate 206, an inverter 208 and a tri-state gate 210 that drives the loop filter 110 shown in FIG. 1. As shown in FIG. 2, two data inputs of D-latches 202 and 204 are connected to VDD. The clock inputs of the D-latches 202 and 204 are connected to the reference clock REFCLK and the output 124 of the frequency divider 114 respectively. The clear inputs of the D-latches 202 and 204 are connected to the output 214 of the NAND gate 206. The output 216 from the D-latch 202 is connected to the input of the inverter 208 and an input of NAND gate 206. The output 218 from D-latch 204 is connected to an input of the tri-state gate 210 and an input of NAND gate 206. The output of the inverter 208 is connected to an input of the tri-state gate 210.

The PFD's output 126 is determined by the rising edges of the reference clock REFCLK and the output 124. When the reference clock REFCLK is leading the output 124, node 216 is driven high until the PFD 200 detects the rising edge of the output 124. Similarly, when the output 124 is leading the reference clock REFCLK, node 218 is driven high until the rising edge of the reference clock REFCLK is detected. Nodes 216 and 218 drive the tri-state gate 210. When the reference clock REFCLK is leading, a capacitor in the loop filter 110 is charged to VDD because the PMOS transistor 222 of the tri-state gate 210 is on and the NMOS transistor 224 is off. The increase in control voltage will increase the frequency of VCO 112. When the output 124 signal is leading, the NMOS transistor 224 of the tri-state gate 210 is on and pulls down the voltage of a capacitor in loop filter 110. The decrease in control voltage will decrease the frequency of the VCO 112.

Figure 3:
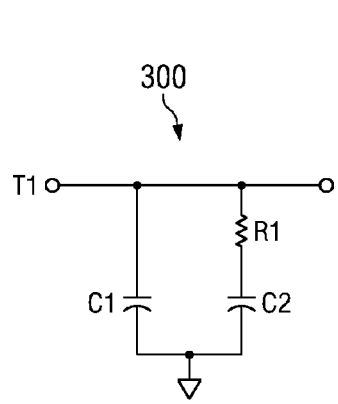
FIG. 3 is a schematic diagram of a loop filter (Prior Art).

FIG. 3 is a schematic diagram of a loop filter 300 (Prior Art). The loop filter 300 used in this example is a low pass filter. It is comprised of a capacitor C1, a capacitor C2 and a resistor R1. One terminal of the capacitor C1 is connected to a terminal T1 of the loop filter 300 and a second terminal of the capacitor C1 is connected to ground. The capacitor C2 and the resistor R1 are connected in series between the terminal T1 and ground. The voltage control for the VCO 112 is taken from the terminal T1 of the loop filter 300. The values of the resistor R1 and the capacitors C1 and C2 are selected such that small changes or interferences do not affect the VCO 112.

Figure 4:
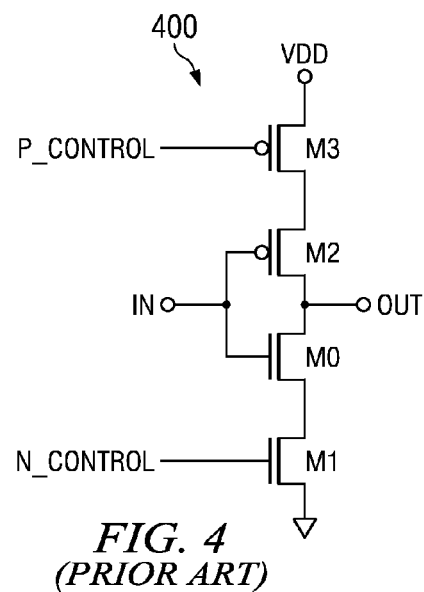
FIG. 4 is a schematic diagram of a current-starved inverter (Prior Art).

FIG. 4 is a schematic diagram of a current-starved inverter 400. The current-starved inverter 400 comprises two PFETs (p-type field-effect transistor) M3 and M2 in series with two NFETs (n-type field-effect transistor) M0 and M1. The source of PFET M3 is connected to VDD and the gate of PFET M3 is connected to P_CONTROL of the current-starved inverter 400. The source of PFET M2 is connected to the drain of PFET M3 while the gate of PFET M2 is connected to the input IN of the current-starved inverter 400. The drain of PFET M2 is connected to the drain of NFET M0 and the output OUT of the current starved inverter. The gate of NFET M0 is connected to the input IN of the current mirror 400 while the source of NFET M0 is connected to the drain of MFET M1. The gate of NFET M1 is connected to N_CONTROL of the current-starved inverter 400. The source of NFET M1 is connected to ground.

Figure 5:
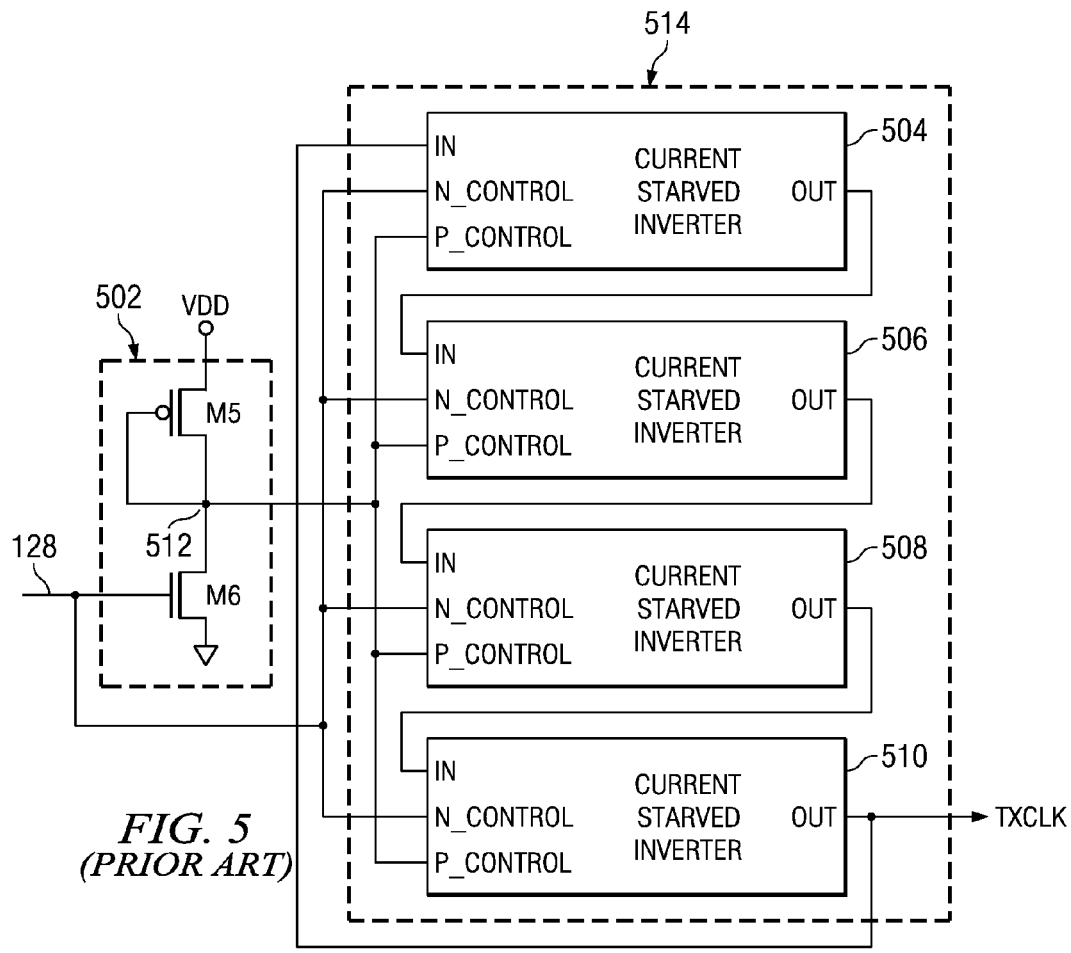
FIG. 5 is a schematic diagram of a voltage controlled oscillator (VCO) (Prior Art).

FIG. 5 is a schematic diagram of a voltage controlled oscillator (VCO) 500 (Prior Art). The VC0, in this example, comprises four current-starved inverters 504, 506, 508, and 510 and a current mirror 502. The current mirror 502 comprises a PFET M5 and an NFET M6. The source of the PFET M5 is connected to VDD while the gate of PFET M5, the drain of PFET M5 and the drain of NFET M6 are connected to node 512. Node 512 drives the P_CONTROL inputs of all four current-starved inverter 504, 506, 508, and 510. The output 128 from the loop filter 110 drives the gate of the NFET M6 and the N_CONTROL inputs of all four current-starved inverter 504, 506, 508, and 510.

The inputs and outputs of the current-starved inverters 504, 506, 508, and 510 are connected to each other to create ring oscillator 514 with the output of the ring oscillator 514 connected to TXCLK. The current mirror circuit 502 takes the output 128 from the loop filter 110 and mirrors the current in the current-starved inverter ring oscillator 514.

The frequency divider 114 divides the output TXCLK of the VCO 112 before feeding its output to the input of the PFD 108. The frequency divider 114 may be designed for programmability. For example, the frequency divider 114 may take an 8 bit input to divide the frequency so the frequency can be divided by 1 to 25 times. In this example, a typical frequency divider has three basic parts; an 8 bit synchronous counter, an array of 2 input XNOR gates and an 8 input NAND gate (not shown).

Figure 6:
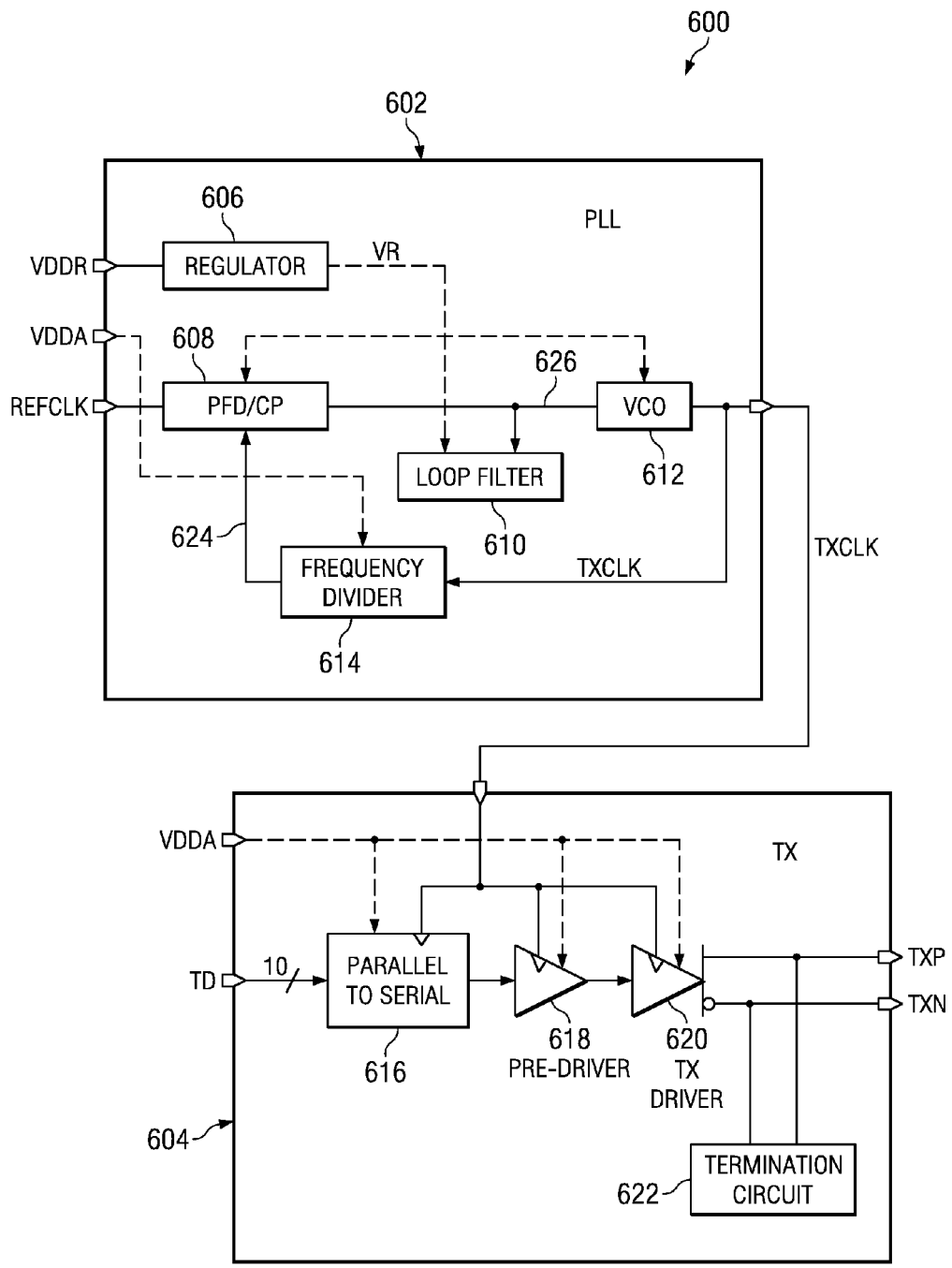
FIG. 6 is a block diagram of a Phase-Locked Loop (PLL) and transmission circuit according to an embodiment of the invention.

FIG. 6 is a block diagram of a Phase-Locked Loop (PLL) 602 and transmission circuit 604 according to an embodiment of the invention. The PLL 602 includes a voltage regulator 606, a phase frequency detector (PFD) 608, a loop filter 610, a voltage control oscillator (VCO) 612, and a frequency divider 614. The voltage regulator 606 regulates voltage VR provided to the phase frequency detector (PFD) 608, the loop filter 610 and the voltage control oscillator (VCO) 612. Power to the frequency divider 614 is provided by VDDA; the power supply used to supply power to the transmission circuit 604. Power supply induced jitter on a SerDes transmitter is reduced when power is provided to the frequency divider 614 in a PLL 602 from the power supply that supplies power to the transmitter circuit 604. This will be explained in more detail later in the specification.

The PFD 608 compares the phase of the output 624 of the frequency divider 614 and the phase of the reference clock REFCLK. To form a PLL, the PFD 608 phase error output 626 is fed to the loop filter 610. The loop filter 610 integrates the phase error output 626 to smooth it. The smoothed signal 626 is fed to the VCO 612. The VCO 612 generates an output signal TXCLK with a frequency that is proportional to the smoothed signal 626. The output signal TXCLK is a clock signal that is used to clock the transmission circuit 604. The VCO output TXCLK is also fed back to the frequency divider 614 to form the PLL circuit 602.

The transmission circuit 604 includes a parallel-to-serial converter 616, a pre-driver 618, a transmission driver 620 and a termination circuit 622. A parallel data input TD provides an input to the parallel-to-serial converter 616. A voltage VDDA is provided for the parallel-to-serial converter 616, the pre-driver 618, the transmission driver 620 and the frequency divider 614. The transmission clock TXCLK from the PLL 602 is electrically connected to the parallel-to-serial converter 116, the pre-driver 618 and the transmission driver 620. The transmission driver 620 provides a differential output with two terminals, TXP (transmission positive) and TXN (transmission negative). A termination circuit 622 is provided on the outputs TXP and TXN to provide impedance matching. Data is serially transmitted from the two terminal TXP and TXN.

When power to the frequency divider 614 is provided by the power supply VDDA used to supply power to the transmission circuit 604, power supply induced jitter on a SerDes transmitter is reduced. For example, when the voltage on power supply VDDA drops, the digital delay (i.e. the time it takes for a signal to propagate from the input of a circuit to the output of a circuit) through the frequency divider 614 increases. The digital delay through the transmission circuit 604 also increases. However, because of the negative feedback provided by the frequency divider 614 in the PLL 602, the delay of the transmission clock TXCLK decreases. As a result, the combined delay of the clock TXCLK entering the transmission circuit 604 and the data (embedded in TXP and TXN) leaving the transmission circuit 604 remains approximately the same as the sum of the delays before VDDA dropped in voltage. In other words, the VDDA supply rejection at the output, TXP and TXN, of the transmission circuit 106 is increased.

Figure 7:
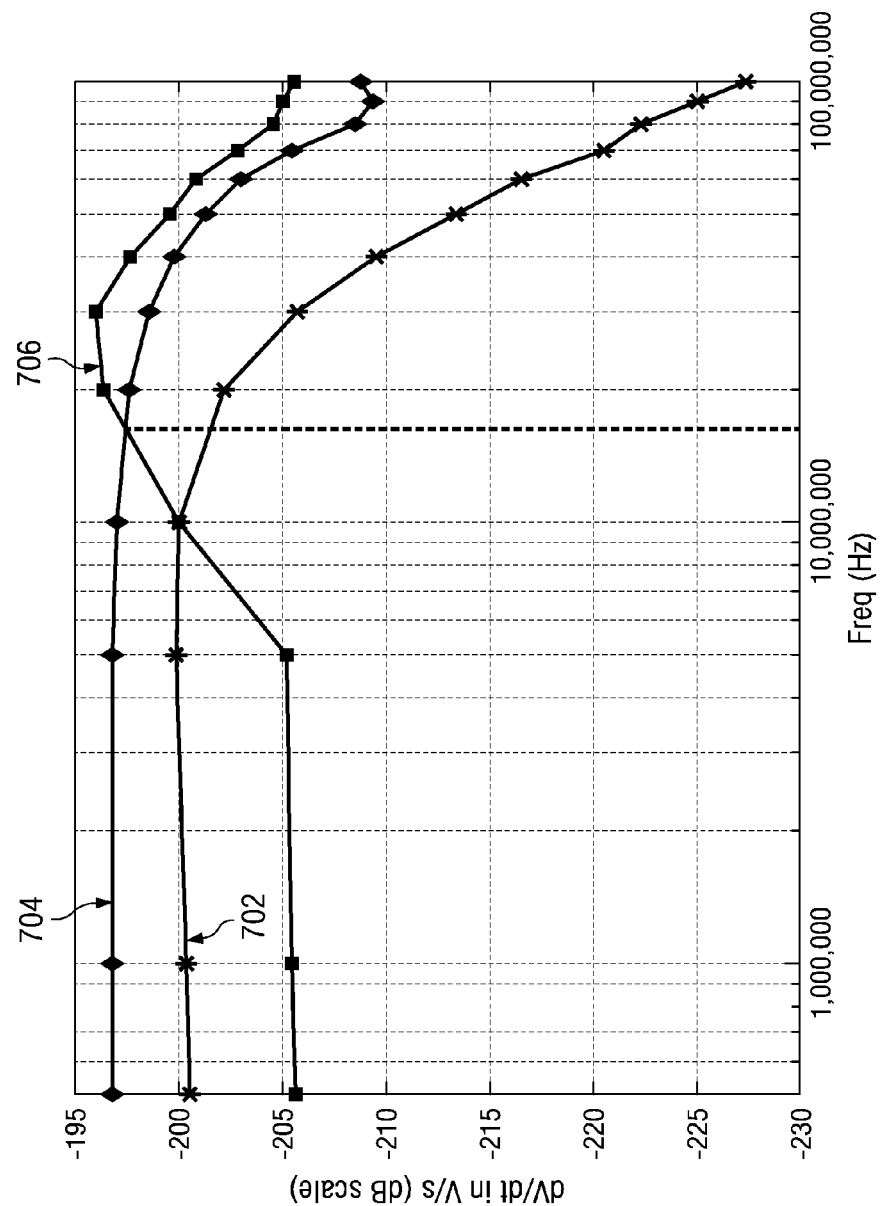
FIG. 7 is a plot of power supply induced jitter as a function of frequency illustrating a reduction in power supply induced jitter on a SerDes transmitter according to an embodiment of the invention.

FIG. 7 is a plot of power supply induced jitter as a function of frequency illustrating a reduction in power supply induced jitter on a SerDes transmitter according to an embodiment of the invention. In FIG. 7, the power supply induced jitter 702 on the output TXCLK of the PLL 102 is shown as a function of frequency. Also in FIG. 7, the power supply induced jitter 704 on the output TXP and TXN of the transmitter circuit 104 is shown as a function of frequency. When the supply voltages of the frequency divider 114 and the transmission circuit 104 are different, the output TXP and TXN of the transmitter circuit 104 have higher power supply induced jitter than the output TXCLK of the PLL 102.

The power supply induced jitter 706 on the output TXP and TXN of the transmitter circuit 604, when the supply voltages of the frequency divider 614 and the transmission circuit are the substantially the same, is shown as a function of frequency. In this example, the power supply induced jitter 706 is lower than the other power supply induced jitter 702 and 704 because power to the frequency divider 614 is provided by VDDA; the power supply used to supply power to the transmission circuit 604. FIG. 7 also shows that the power supply induced jitter 706 on the output TXP and TXN begins to increase at about 5 MHZ and reaches a maximum at about 17 MHZ. The effect of the increase in power supply induced jitter beyond 17 MHZ can be reduced by using a low pass filter on the power supply.

In another embodiment of the invention, the power supply induced jitter may be further reduced by making the digital delay from the input of the frequency divider 614 to the output of the frequency divider 614 approximately equal to the digital delay from the input of the transmission circuit 604 to the output of the transmission circuit 604.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A communication apparatus comprising:
a phase-locked loop (PLL) circuit, the PLL circuit including a frequency divider wherein the PLL circuit is configured to receive a first direct current (DC) reference voltage, a second DC voltage and a reference clock signal and wherein the PLL circuit is configured to generate a transmission clock signal;
a transmission circuit, the transmission circuit configured to receive the transmission clock signal, the second DC voltage, a data bus, wherein the data bus includes a plurality of data bits in parallel and wherein the transmission circuit transmits data serially;
wherein the second DC voltage provides electrical power to only the frequency divider and the transmission circuit.

2. The apparatus of claim 1 wherein the PLL circuit further comprises a voltage regulator wherein the voltage regulator regulates the first DC reference voltage.

3. The apparatus of claim 1 wherein a digital delay through the frequency divider is approximately equal to a digital delay through the transmission circuit.

4. A communication apparatus comprising:
a phase-locked loop (PLL) circuit, the PLL comprising:
a frequency divider; the frequency divider having an input and an output;
a phase-frequency detector (PFD), the PFD having a first input, a second input and an output wherein the first input of the PFD is electrically connected to the output of the frequency divider and the second input is electrically connected to a reference clock signal;
a loop filter, the loop filter having a first and second terminal, wherein the first terminal of the loop filter is electrically connected to the output of the PFD and the second terminal is connected to ground;
a voltage controlled oscillator (VCO), the VCO having an input and an output wherein the input of the VCO is electrically connected to the first terminal of the loop filter and the output of the VCO is electrically connected to the input of the frequency divider;
a transmission circuit, the transmission circuit comprising:
a parallel-to-serial converter, the parallel-to-serial converter having an input and an output;
a pre-driver, the pre-driving having an input and an output wherein the input of the pre-driver is electrically connected to the output of the parallel-to-serial converter;
a transmission driver, the transmission driver having an input and differential outputs wherein the input of the transmission driver is electrically connected to the output of the pre-driver;
a termination circuit, the termination circuit electrically connected to the differential outputs of the transmission driver;
wherein the PLL circuit is configured to receive a first direct current (DC) reference voltage, a second DC voltage and the reference clock signal; wherein the output of the VCO generates a transmission clock signal; wherein the PFD, the loop filter and the VCO receive power from the first DC reference voltage and the frequency divider receives power from only the second DC voltage;
a transmission circuit, the transmission circuit configured to receive the transmission clock signal, the second DC voltage, a data bus; wherein the data bus includes a plurality of data bits in parallel and wherein the transmission circuit transmits data serially through the differential outputs of the transmission driver;
wherein the second DC voltage provides electrical power to the parallel-to-serial converter, the pre-driver and the transmission driver.

5. The apparatus of claim 4 wherein the first DC reference voltage is greater than the second DC voltage.

6. The apparatus of claim 4 wherein the PLL circuit further comprises a voltage regulator wherein the voltage regulator regulates the first DC reference voltage.

7. The apparatus of claim 4 wherein a digital delay through the frequency divider is approximately equal to a digital delay through the transmission circuit.

8. The apparatus of claim 4 further wherein the loop filter comprises:
a resistor, the resistor having a first terminal and a second terminal wherein the first terminal of the resistor is electrically connected to the first terminal of the loop filter;
a first capacitor, the capacitor having a first terminal and a second terminal wherein the first terminal of the capacitor is electrically connected to the first terminal of the resistor and the second terminal of the capacitor is electrically connected to ground;
a second capacitor, the capacitor having a first terminal and a second terminal wherein the first terminal of the capacitor is electrically connected to the second terminal of the resistor and the second terminal of the capacitor is electrically connected to ground.

* * * * *